United States Patent
Fay et al.

(10) Patent No.: US 11,309,285 B2
(45) Date of Patent: Apr. 19, 2022

(54) THREE-DIMENSIONAL STACKING SEMICONDUCTOR ASSEMBLIES AND METHODS OF MANUFACTURING THE SAME

(71) Applicant: Micron Technology, Inc., Boise, ID (US)

(72) Inventors: Owen R. Fay, Meridian, ID (US); Chan H. Yoo, Boise, ID (US); Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 16/440,328

(22) Filed: Jun. 13, 2019

(65) Prior Publication Data

US 2020/0395337 A1    Dec. 17, 2020

(51) Int. Cl.
| | |
|---|---|
| *H01L 25/065* | (2006.01) |
| *H01L 21/56* | (2006.01) |
| *H01L 23/31* | (2006.01) |
| *H01L 23/532* | (2006.01) |
| *H01L 23/00* | (2006.01) |

(52) U.S. Cl.
CPC ........ *H01L 25/0657* (2013.01); *H01L 21/561* (2013.01); *H01L 23/3171* (2013.01); *H01L 23/53238* (2013.01); *H01L 24/17* (2013.01); *H01L 24/96* (2013.01); *H01L 2224/02381* (2013.01); *H01L 2224/165* (2013.01)

(58) Field of Classification Search
CPC . H01L 25/0657; H01L 24/17; H01L 23/3171; H01L 23/53238; H01L 2224/165
See application file for complete search history.

(56) References Cited

U.S. PATENT DOCUMENTS

| | | | | |
|---|---|---|---|---|
| 6,294,837 B1 * | 9/2001 | Akram | ..................... | H01L 24/75 257/774 |
| 8,030,780 B2 * | 10/2011 | Kirby | ................... | H01L 23/481 257/774 |
| 8,637,968 B2 * | 1/2014 | Haba | ...................... | H01L 23/36 257/686 |

(Continued)

FOREIGN PATENT DOCUMENTS

WO    2011105961 A1    9/2011

OTHER PUBLICATIONS

International Application No. PCT/US2020/034594—International Search Report and Written Opinion, dated Jul. 27, 2020, 14 pages.

*Primary Examiner* — Eugene Lee
(74) *Attorney, Agent, or Firm* — Perkins Coie LLP

(57) ABSTRACT

Semiconductor device packages and associated assemblies are disclosed herein. In some embodiments, the semiconductor device package includes a substrate having a first side and a second side opposite the first side, a first metallization layer positioned at the first side of the substrate, and a second metallization layer in the substrate and electrically coupled to the first metallization layer. The semiconductor device package further includes a metal bump electrically coupled to the first metallization layer and a divot formed at the second side of the substrate and aligned with the metal bump. The divot exposes a portion of the second metallization layer and enables the portion to electrically couple to another semiconductor device package.

19 Claims, 14 Drawing Sheets

(56) References Cited

U.S. PATENT DOCUMENTS

| | | | |
|---|---|---|---|
| 8,736,066 B2* | 5/2014 | Oganesian | H01L 21/78 |
| | | | 257/774 |
| 8,847,380 B2* | 9/2014 | Oganesian | H01L 23/50 |
| | | | 257/698 |
| 9,269,692 B2* | 2/2016 | Oganesian | H01L 21/76898 |
| 2006/0278979 A1 | 12/2006 | Rangel | |
| 2008/0001289 A1* | 1/2008 | Ma | H01L 25/0657 |
| | | | 257/737 |
| 2008/0237881 A1* | 10/2008 | Dambrauskas | H01L 25/0657 |
| | | | 257/774 |
| 2008/0290491 A1* | 11/2008 | Yamano | H01L 25/105 |
| | | | 257/686 |
| 2009/0127686 A1* | 5/2009 | Yang | H01L 24/82 |
| | | | 257/686 |
| 2010/0105169 A1* | 4/2010 | Lee | H01L 24/11 |
| | | | 438/107 |
| 2011/0309492 A1 | 12/2011 | Chi et al. | |
| 2013/0026599 A1* | 1/2013 | Nakamura | H01L 23/481 |
| | | | 257/508 |
| 2016/0086874 A1* | 3/2016 | Choi | H01L 23/481 |
| | | | 257/751 |
| 2018/0233462 A1* | 8/2018 | Gong | H01L 24/96 |
| 2019/0088599 A1* | 3/2019 | Seto | H01L 23/481 |
| 2019/0238134 A1* | 8/2019 | Lee | H01L 29/7883 |
| 2019/0245543 A1* | 8/2019 | Lee | G11C 11/412 |
| 2020/0235073 A1* | 7/2020 | Chen | H01L 21/56 |

* cited by examiner

THREE-DIMENSIONAL STACKING SEMICONDUCTOR ASSEMBLIES AND METHODS OF MANUFACTURING THE SAME

TECHNICAL FIELD

The present technology is directed to semiconductor assemblies having stackable semiconductor packages therein. More particularly, some embodiments of the present technology relate to semiconductor assemblies manufactured by a three-dimensional stacking (3DS) process. In such embodiments, the semiconductor packages are directly, electrically coupled to one another without using through-silicon vias (TSVs).

BACKGROUND

Packaged semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. Semiconductor manufacturers continually reduce the size of die packages to fit within the space constraints of electronic devices. One approach for increasing the processing power of a semiconductor package is to vertically stack multiple semiconductor dies on top of one another in a single package. The dies in such vertically-stacked packages can be electrically interconnected by using TSVs. One drawback of using TSVs is that it requires multiple steps to form the TSVs and some of these steps, such as a photo lithography process, can be time consuming and expensive.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate, wafer, or die that is singulated from a wafer or substrate. Throughout the disclosure, semiconductor dies are generally described in the context of semiconductor devices but are not limited thereto.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device package assembly" can refer to an assembly that includes multiple stacked semiconductor device packages. As used herein, the terms "vertical," "lateral," "upper," and "lower" can refer to relative directions or positions of features in the semiconductor device or package in view of the orientation shown in the Figures. These terms, however, should be construed broadly to include semiconductor devices having other orientations, such as inverted or inclined orientations.

Figure 1:
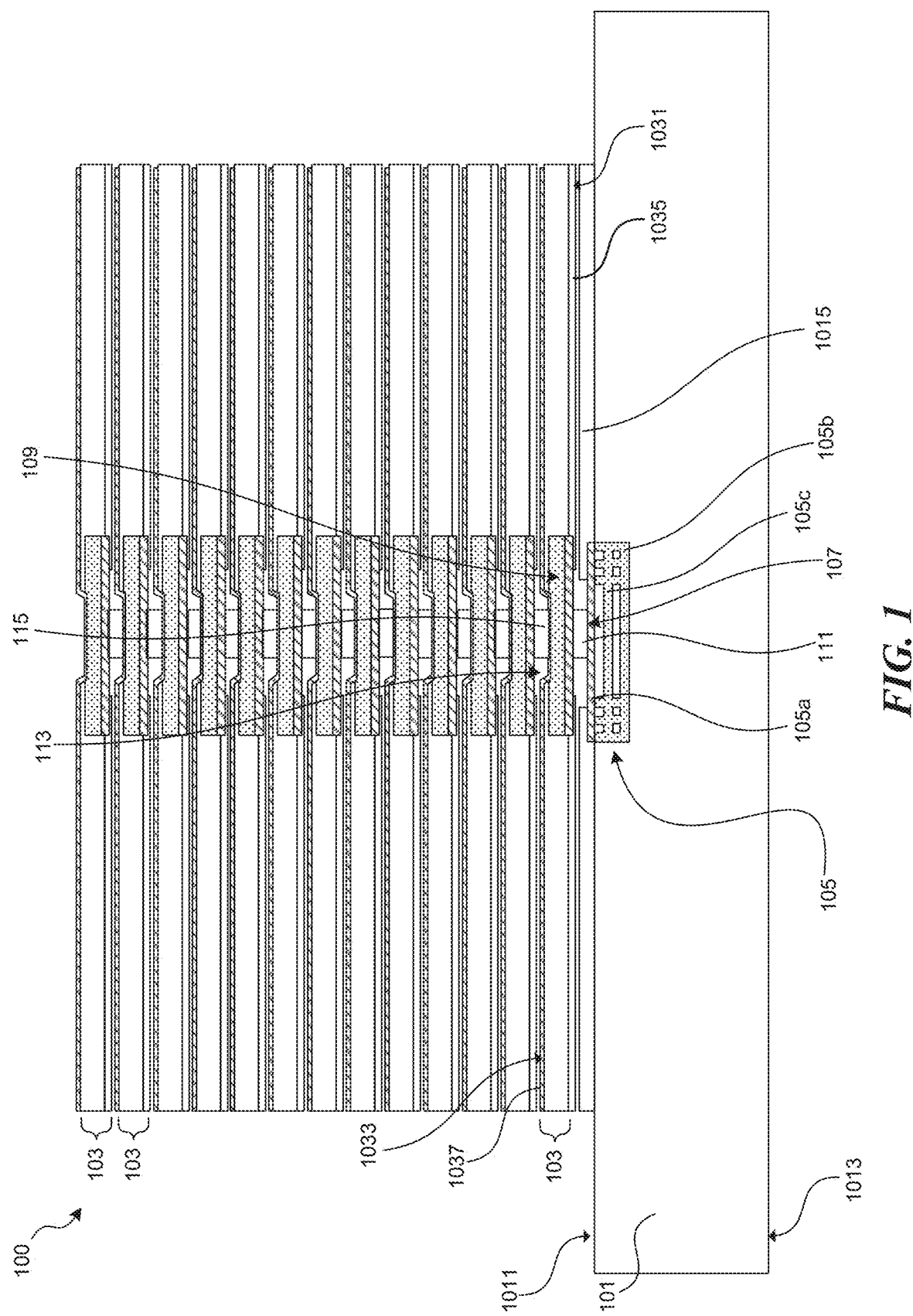
FIG. 1 is a schematic cross-sectional view of a semiconductor device package assembly in accordance with an embodiment of the present technology.

FIG. 1 is a schematic cross-sectional view of a semiconductor device package assembly 100 in accordance with an embodiment of the present technology. As shown, the semiconductor device package assembly 100 includes a base substrate 101 and multiple semiconductor device packages 103 stacked on the base substrate 101. Although the illustrated embodiment shows thirteen (13) separate, stacked semiconductor device packages 103, it will be appreciated that the semiconductor device package assembly 100 can include any suitable number of stacked semiconductor device packages 103 in other embodiments.

In some embodiments, the base substrate 101 can include a base wafer having one or more semiconductor components (e.g., a diet not shown) therein. In some embodiments, the base substrate 101 can be a circuit board or other type of substrate commonly used in semiconductor device packages. As shown, the base substrate 101 has a first side 1011 (e.g., a front/active side) and a second side 1013 (e.g., a back/inactive side) opposite to the first side 1011.

The base substrate 101 can include a passivation layer 1015 at the first side 1011 configured to protect the base substrate 101. In some embodiments, the passivation layer 1015 can include an oxide layer, an inert layer (e.g., a layer that is less likely to chemically react with air or corrode), or other suitable protective layers. In some embodiments, the passivation layer 1015 can include a protective film. In some embodiments, the base substrate 101 can be further coupled to an interposer substrate by electric couplers such as solder bumps or solder balls.

As shown, the base substrate 101 includes multiple metallization layers 105 (or a first set of metallization layers) positioned therein and configured to electrically couple to the one or more semiconductor components (not shown) in the base substrate 101. In the illustrated embodiments, the metallization layers 105 can include first, second, and third metallization layers 105a, 105b, and 105c. In some embodiments, the first metallization layer 105a can include aluminum, or other suitable metal or conductive materials. In some embodiments, the first metallization layer 105a can be implemented as an aluminum pad. In some embodiments, the second metallization layer 105b can include copper or other suitable metal or conductive material. In some embodiments, the third metallization layer 105c can include copper or other suitable metal or conductive materials.

In the illustrated embodiments, the metallization layers 105 can be formed during a back-end-of-line (BEOL) manufacturing process. The first metallization layer 105a can include a contacting area 107 configured to be in contact with the semiconductor device package 103 (e.g., electrically and physically), when the semiconductor device package 103 is stacked on the base substrate 101.

In the illustrated embodiments shown in FIG. 1, individual semiconductor device packages 103 have a first side 1031 (e.g., a front/active side) and a second side 1033 (e.g., a back/inactive side) opposite to the first side 1031. As shown, the individual semiconductor device packages 103 also can include a passivation layer 1035 at the first side 1031 of the semiconductor device package 103 configured to protect the semiconductor device package 103. In some embodiments, the passivation layer 1035 can include an oxide layer, an inert layer (e.g., a layer that is less likely to chemically react with air or corrode), or other suitable protective layers. In some embodiments, the passivation layer 1035 can include a protective film.

As shown, the individual semiconductor device packages 103 can also include a dielectric layer 1037 at the second side 1033 of the semiconductor device package 103. In some embodiments, the dielectric layer 1037 can protect the semiconductor device package 103. In some embodiments, the dielectric layer 1037 can be a dielectric film.

The individual semiconductor device packages 103 can also include one or more metallization layers 109 (or a second set of metallization layers) configured to electrically couple to one or more semiconductor components (e.g., a die; not shown) in the semiconductor device package 103. In the illustrated embodiments, the metallization layers 109 can include aluminum, copper, or other suitable metal or conductive materials. In some embodiments, the metallization layer 109 can be formed during a BEOL manufacturing process. In some embodiments, the metallization layer 109 can include multiple metallization layers (similar to the first, second, and third metallization layers 105a, 105b, and 105c discussed above).

The semiconductor device package assembly 100 further includes a metal bump 111 located at the first side 1031 of the individual semiconductor device package 103. The metal bump 111 electrically couples to the metallization layer 109 and is configured to be in contact with the first metallization layer 105a of the base substrate 101 (e.g., at the contacting area 107). In some embodiments, the metal bump 111 can include an indium bump. In other embodiments, the metal bump 111 can include other suitable conductive materials.

The individual semiconductor device packages 103 have a recess 113 (or a "divot") at the second side 1033. The recess 113 is configured to enable the metallization layer 109 to be in contact with another semiconductor device package 103 via another metal bump 115. By this arrangement, the present technology enables the base substrate 101 to electrically couple to the semiconductor device packages 103 without using a TSV.

In some embodiments, the semiconductor device package assembly 100 can be a memory device in which the semiconductor device packages 103 are memory dies (e.g., DRAM, LPDRAM, SRAM, Flash, etc.). In some embodiments, the base substrate 101 can be a logic device, processor, and/or another memory device.

Figure 2A:
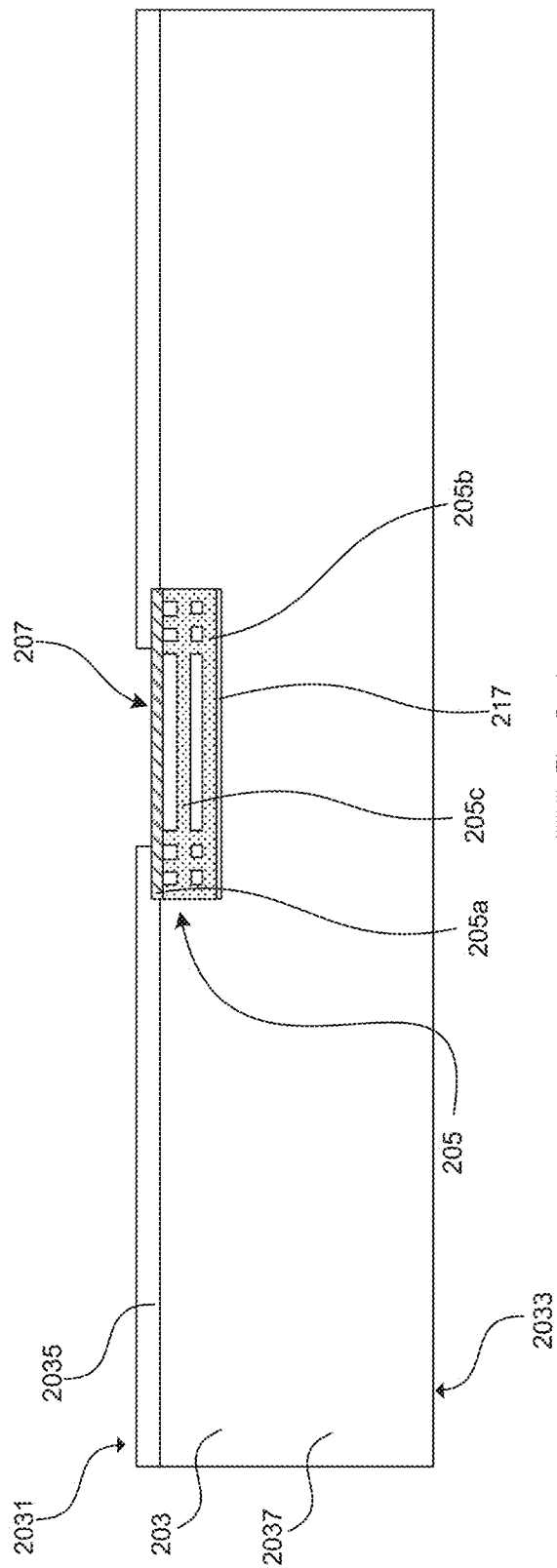
FIGS. 2A-2J are schematic cross-sectional views illustrating a method of forming a semiconductor device package in accordance with an embodiment of the present technology.

FIGS. 2A-2J are schematic cross-sectional views of a method for manufacturing a semiconductor device package 203 in accordance with the present technology. Like reference numbers refer to like components throughout FIGS. 2A-2J. Referring to FIG. 2A, the semiconductor device package 203 has a first side 2031 (e.g., a front/active side) and a second side 2033 (e.g., a back/inactive side) opposite to the first side 2031. The semiconductor device package 203 can have a substrate 2057 and metallization layers 205 formed during the BEOL manufacturing process. The metallization layers 205 can include first, second, and third metallization layers 205a, 205b, and 205c in the substrate 2037. In some embodiments, the first metallization layer 205a can include aluminum, or other suitable metal or conductive materials. In some embodiments, the first metallization layer 205a can be implemented as an aluminum pad. In some embodiments, the second metallization layer 205b can include copper or other suitable metal or conductive material. In some embodiments, the third metallization layer 205c can include copper or other suitable metal or conductive materials.

In some embodiments, the semiconductor device package 203 can also have a barrier layer 217 between a portion of the metallization layers 205 and the substrate 2037. In some embodiments, the barrier layer 217 is adjacent to the second metallization layer 205b. In some embodiments, the barrier layer 217 can be made of a metal such as tantalum. In some embodiments, the second metallization layer 205b can include copper, and the barrier layer 217 made of tantalum can protect the second metallization layer 205b from diffusion or corruption.

As shown in FIG. 2A, the semiconductor device package 203 includes a passivation layer 2035 at the first side 2031 of the semiconductor device package 203 configured to protect the semiconductor device package 203. In some embodiments, the passivation layer 2035 can include an oxide layer, an inert layer (e.g., a layer that is less likely to chemically react with air or corrode), or other suitable protective layers. In some embodiments, the passivation layer 2035 can include a protective film. The semiconductor device package 203 can also include a contacting area 207 on the first metallization layer 205a at the first side 2031.

Figure 2B:
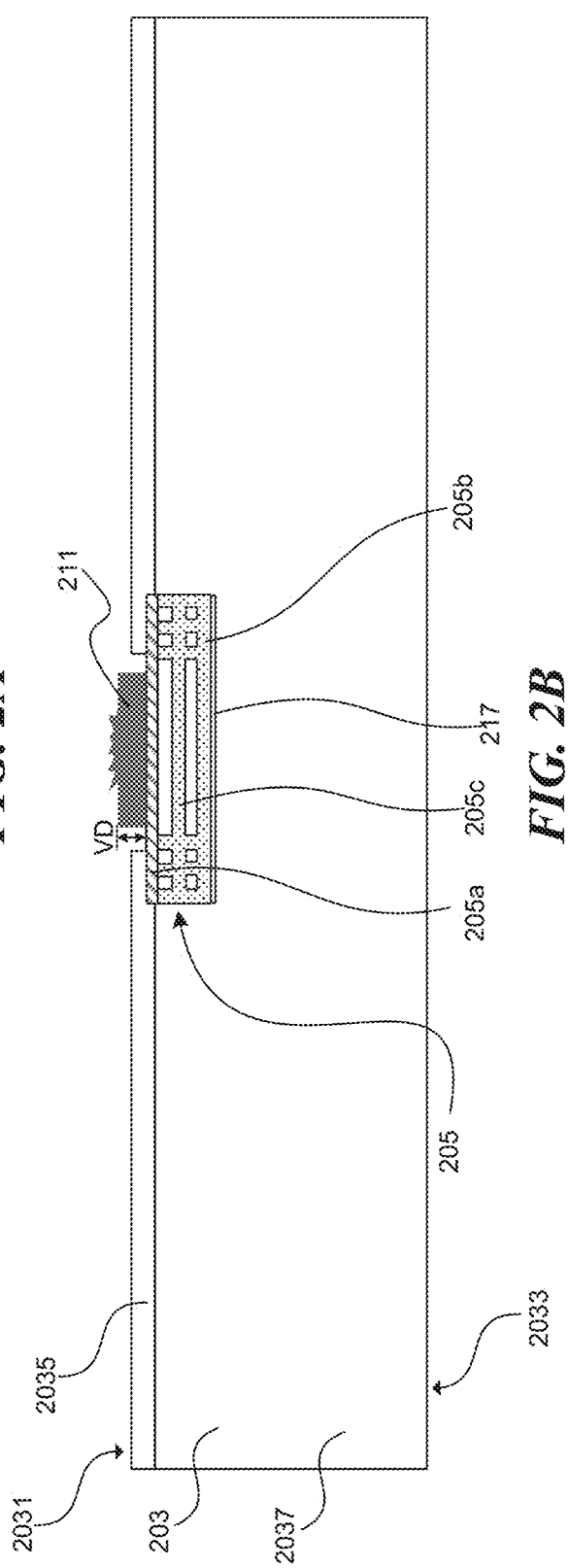

Referring to FIG. 2B, the semiconductor device package 203 can also include a metal bump 211 on the contacting area 207. The metal bump 211 is electrically coupled to the metallization layer 205 and configured to be in electrical contact with a metallization layer of another semiconductor device package (see e.g., FIG. 1). In some embodiments, the metal bump 211 can include an indium bump. In other embodiments, the metal bump 211 can include other suitable conductive materials.

In some embodiments, the metal bump 211 can have a vertical dimension VD of approximately 10-20 µm. In some embodiments, the vertical dimension VD can be approximately 15 µm. In some embodiments, the metal bump 211 can be formed by an electroplating process. In some embodiments, the metal bump 211 can be formed by having a seed material in the contact area 207 of the first metallization layer 205a. The seed material can facilitate forming the metal bump 211 on the first metallization layer 205a. In some embodiments, the metal bump 211 can be formed by an inkjet process. In other embodiments, the metal hump 211 can be formed by other suitable methods. In some embodiments, the metal bump 211 can be cold annealed.

Figure 2C:
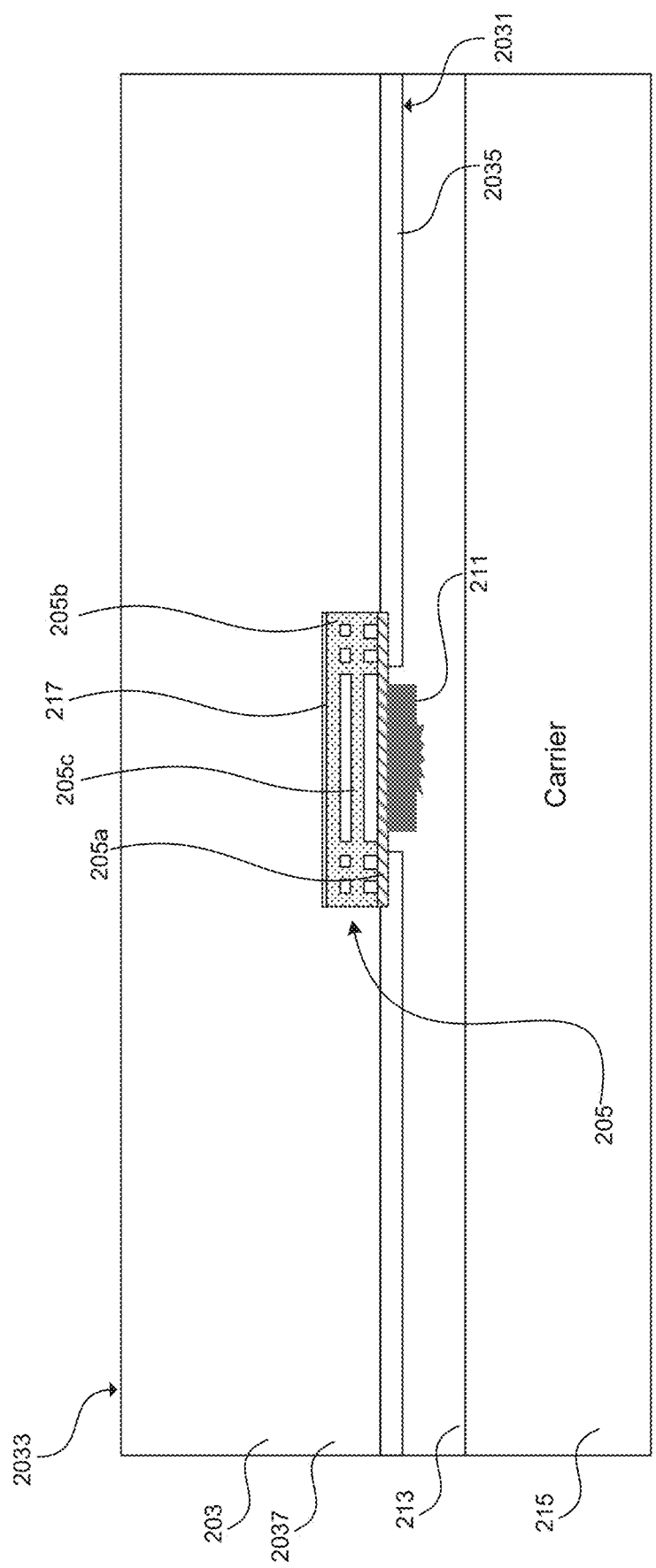

FIG. 2C shows the semiconductor device package 203 after it has been coupled to a carrier 215 via a bonding layer 213. The carrier 215 is configured to hold and support the semiconductor device package 203 in the manufacturing process described below with reference to FIGS. 2D-2J. In some embodiments, the carrier 215 can be a reusable carrier (e.g., a glass carrier). In some embodiments, the carrier 215 can be a non-reusable carrier (e.g., a silicon or plastic carrier). In some embodiments, the bonding layer 213 can be a release tape (e.g., gas-sensitive or temperature-sensitive). In such embodiments, in response to a particular type of laser or gas, the bonding layer 213 can dissolve and accordingly release the semiconductor device package 203 from the carrier 215. Relevant embodiments are discussed below with reference to FIG. 3A. In some embodiments, the bonding layer 213 can be an adhesive layer or other suitable bonding materials.

Figure 2D:
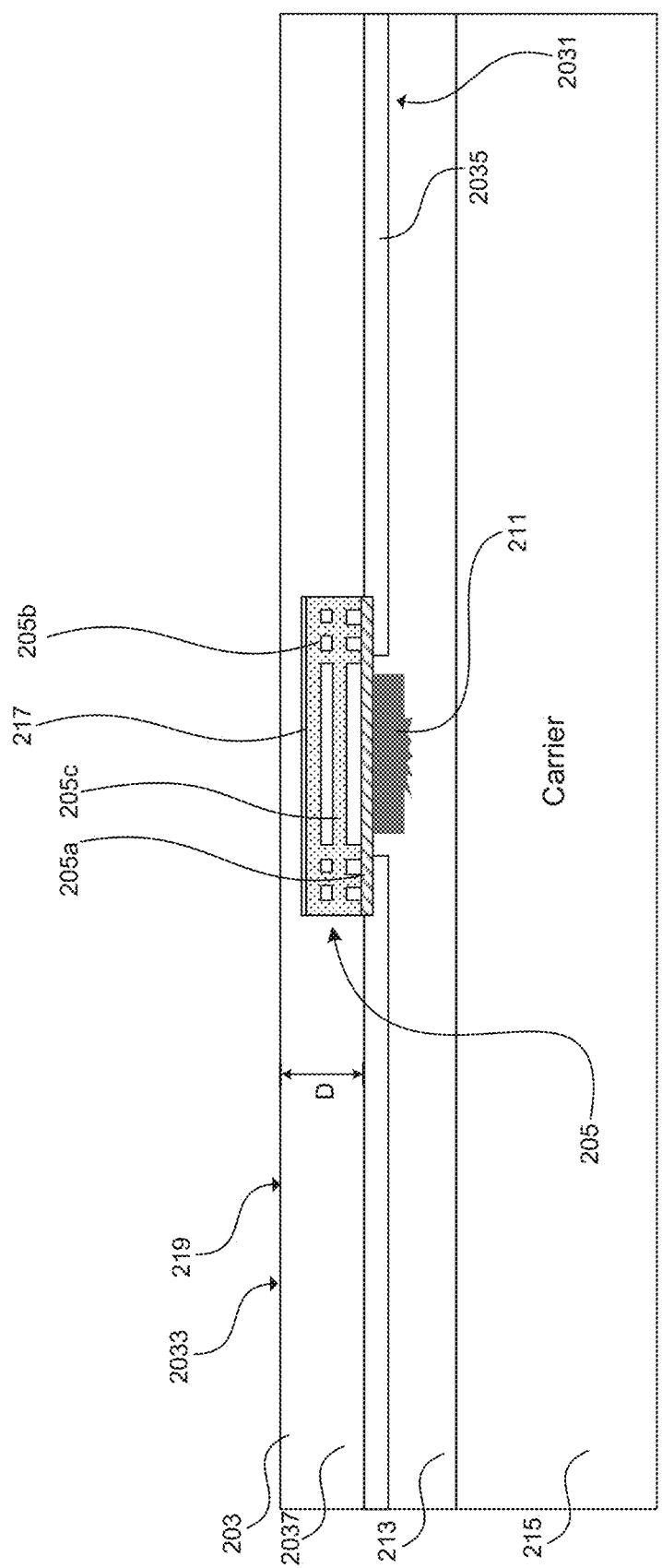

FIG. 2D illustrates the semiconductor device package 203 after the substrate 2037 has been thinned. Referring to FIG. 2D, the semiconductor device package 203 can be thinned such that the depth D between a thinned surface 219 and the first side 2031 of the semiconductor device package 203 is approximately 10 μm (e.g., excluding the depth of the passivation layer 2035). In some embodiments, the depth D can range from 5-30 μm. In some embodiments, the semiconductor device package 203 can be thinned that the depth D is not more than 30 μm, 25 μm, 20 μm, 15 μm, 10 μm or 5 μm.

By thinning the substrate 2037 to this extent, the metalation layers 205 of the semiconductor device package 203 can be accessed and electrically coupled to other metalation layers or semiconductor components of another semiconductor device package without using a TSV. Generally speaking, to form a TSV in a semiconductor structure, the smallest depth of the semiconductor structure that the semiconductor structure can be thinned is around 50 μm. Therefore, the improved method provided by the present technology is advantageous at least because it can manufacture and stack semiconductor device packages with smaller depths (or vertical dimensions) and without the processing steps to form TSVs. It is particularly beneficial for manufacturing compact semiconductor devices or packages.

Figure 2E:
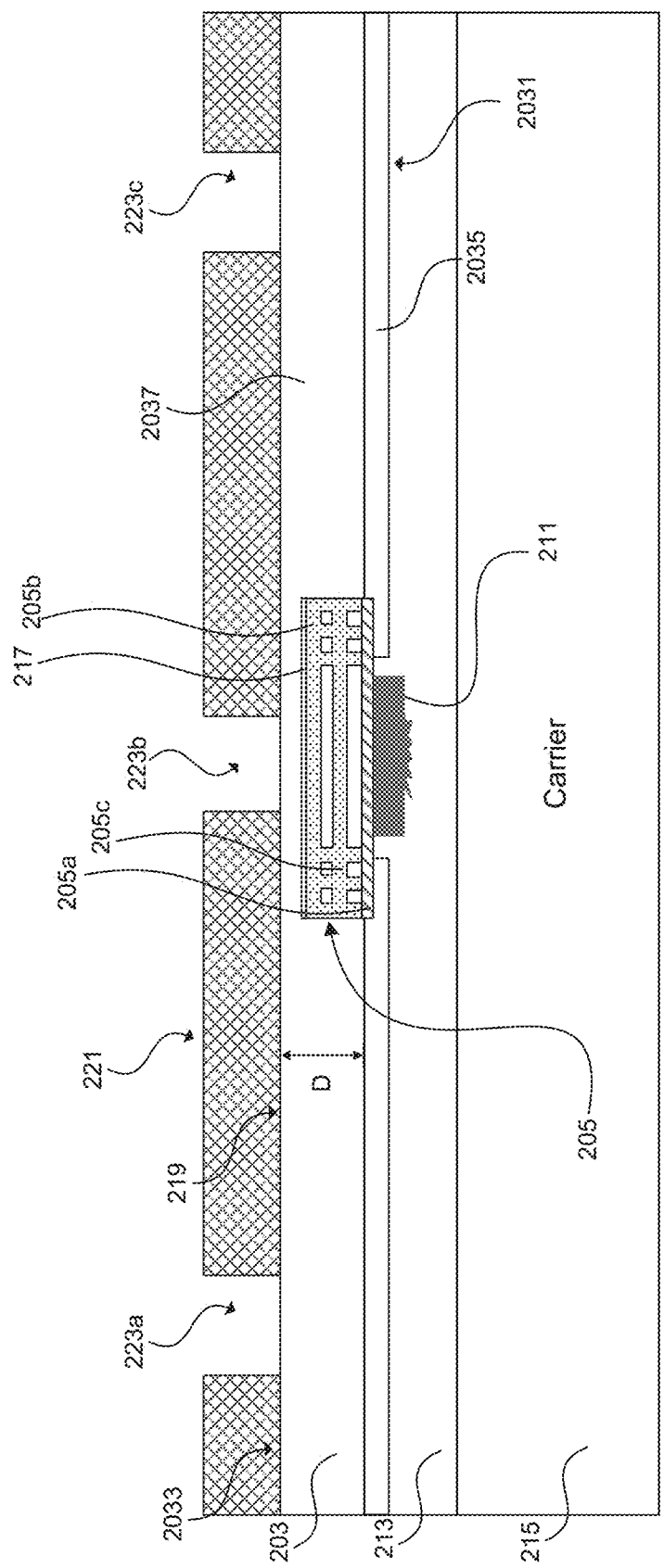

FIG. 2E illustrates a process of forming a first photo-resistant layer 221 (or a first photo-pattern mask) on the second side 2033 (back/inactive side) of the semiconductor device package 203. As shown, the first photo-resistant layer 221 is formed with multiple openings 223 (only three are shown in FIG. 2E-first, second, and third openings 223a, 223b, and 223c ). As shown, the first and third openings 223a, 223c are formed on opposite sides of the semiconductor device package 203. The first and third openings 223a, 223c can be used to separate or "cingulate" the semiconductor device package 203 later in the process. The second opening 223b is aligned with at least a portion of the metal layers 205.

Figure 2F:
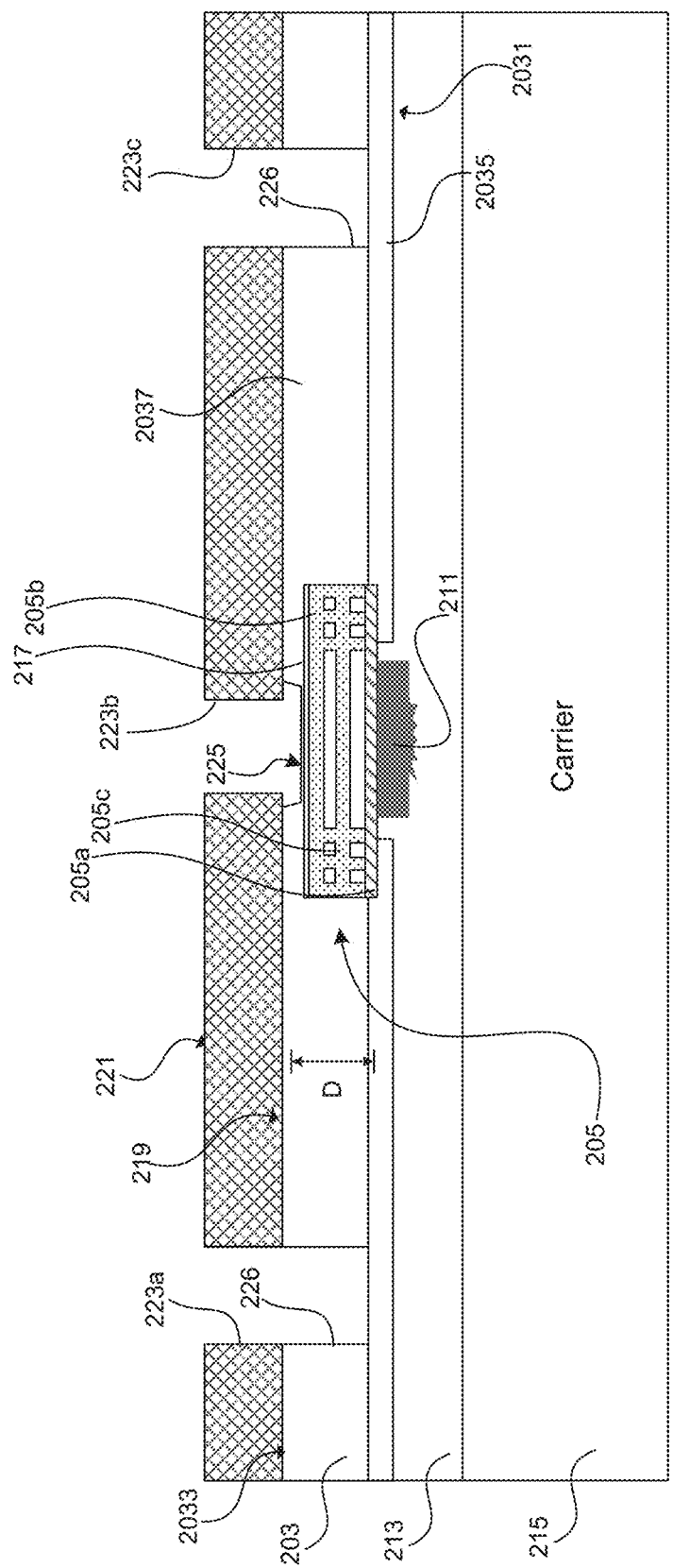

FIG. 2F shows the semiconductor device package 203 after openings 226 have been formed through the first and third openings 223a, 223c to expose the passivation layer 2035. The openings 226 can be formed by etching the substrate 2037 of the semiconductor device package 203. In the same process, a recess 225 (e.g., a divot can be formed in the substrate 2037 through the second opening 223b (e.g., the second opening 223b extends in the direction toward the first side 2031 of the semiconductor device package 203). The recess 225 can be another opening that expose the barrier layer 217. As shown, the divot 225 are formed with sloped sidewalls (at both left and right sides of the divot 225, as shown in FIG. 2F), which can facilitate coupling or positioning a metal bump of another semiconductor device package to the metallization layers 205. The recess 225 can be formed in the same etching process as the openings 226.

Figure 2G:
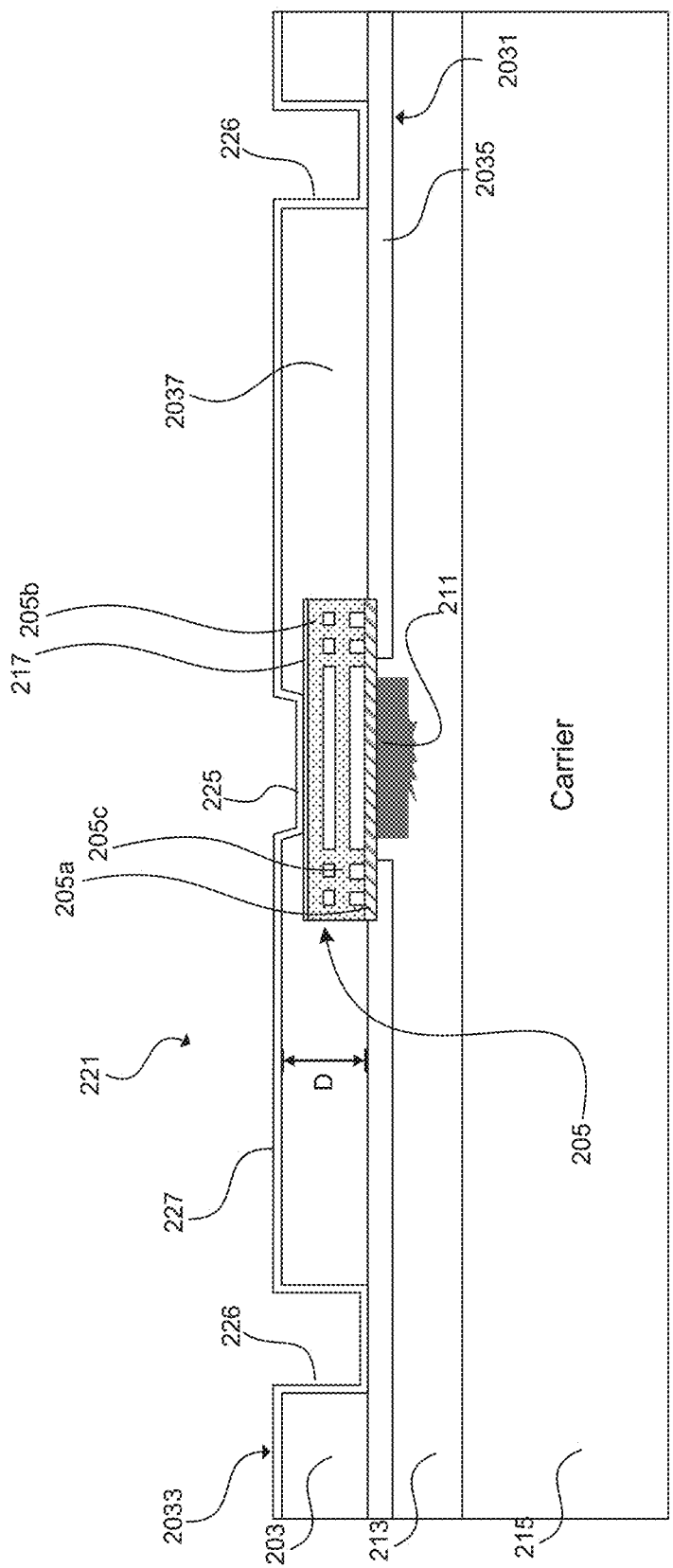

FIG. 2G shows the semiconductor device package 203 after the first photo-resistant layer 221 has been removed and a dielectric layer 227 has been formed on the second side 2033 of the semiconductor device package 203. In some embodiments, the dielectric layer 227 can be formed by a chemical vapor deposition (CVD) process. In some embodiments, the dielectric layer 227 can be formed by using tetraethyl-orthosilicate (mos) in a CND process. In some embodiments, the dielectric layer 227 can be formed by a spinning process. In some embodiments, the dielectric layer 227 can be a dielectric film.

Figure 2H:
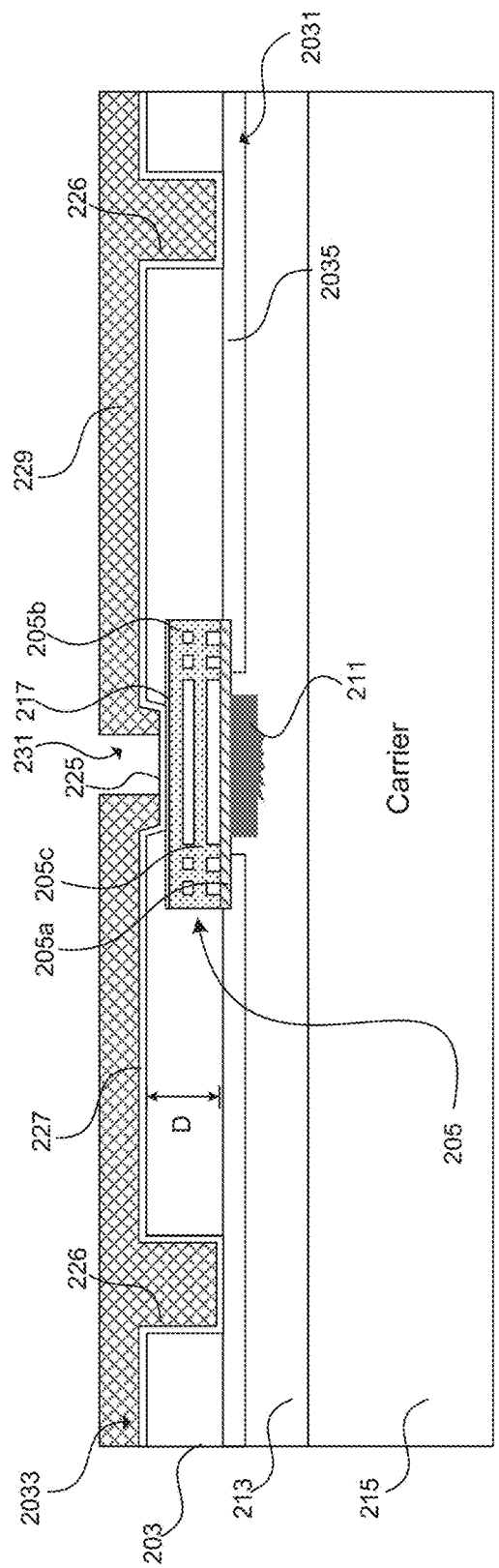
Figure 2I:
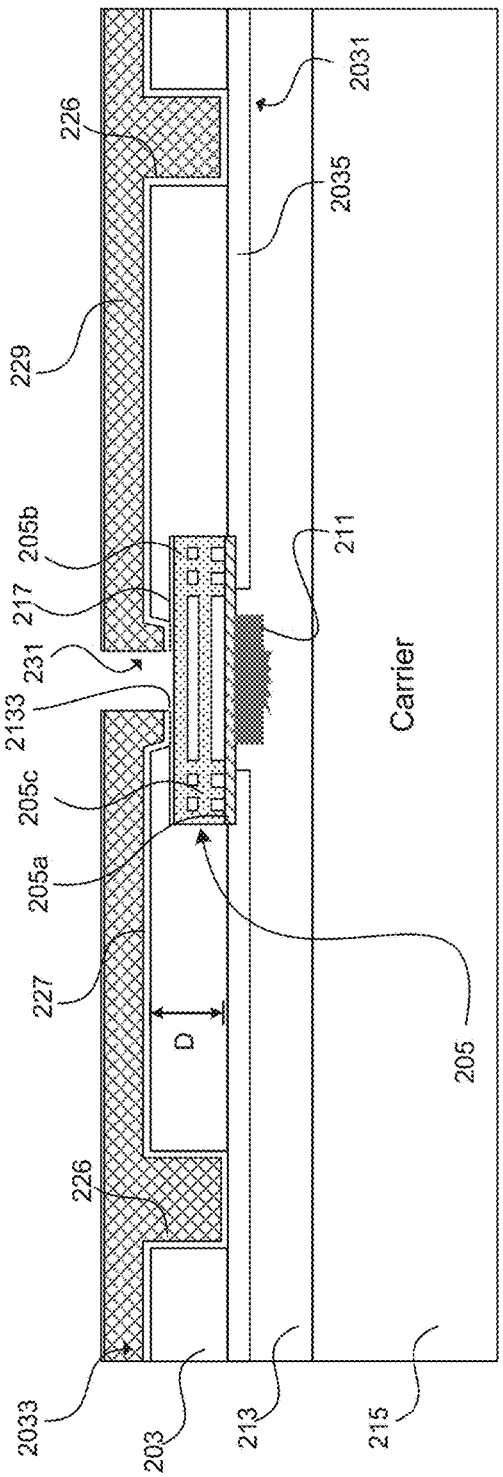

As shown in FIGS. 2H and 2I, a second photo-resistant layer 229 (or a second photo-pattern mask) can be formed on the second side 2033 (back/inactive side) of the semiconductor device package 203. As shown, the second photo-resistant layer 229 fills the first and third openings 223a, 223c. The second photo-resistant layer 229 is patterned and developed to form an opening 231. In the embodiment shown in FIG. 2H, the opening 31 is aligned with the metal layers 205. In FIG. 2I, the dielectric layer 227 and the barrier layer 217 within the opening 231 are removed to expose the third metallization layer 205c through an opening 2133. In some embodiments, the barrier layer 217 is not removed. Factors to consider whether to remove the barrier layer 217 include, for example, the types of materials used in the barrier layer 217, the third metallization layer 205c, and the metal bump 211.

Figure 2J:
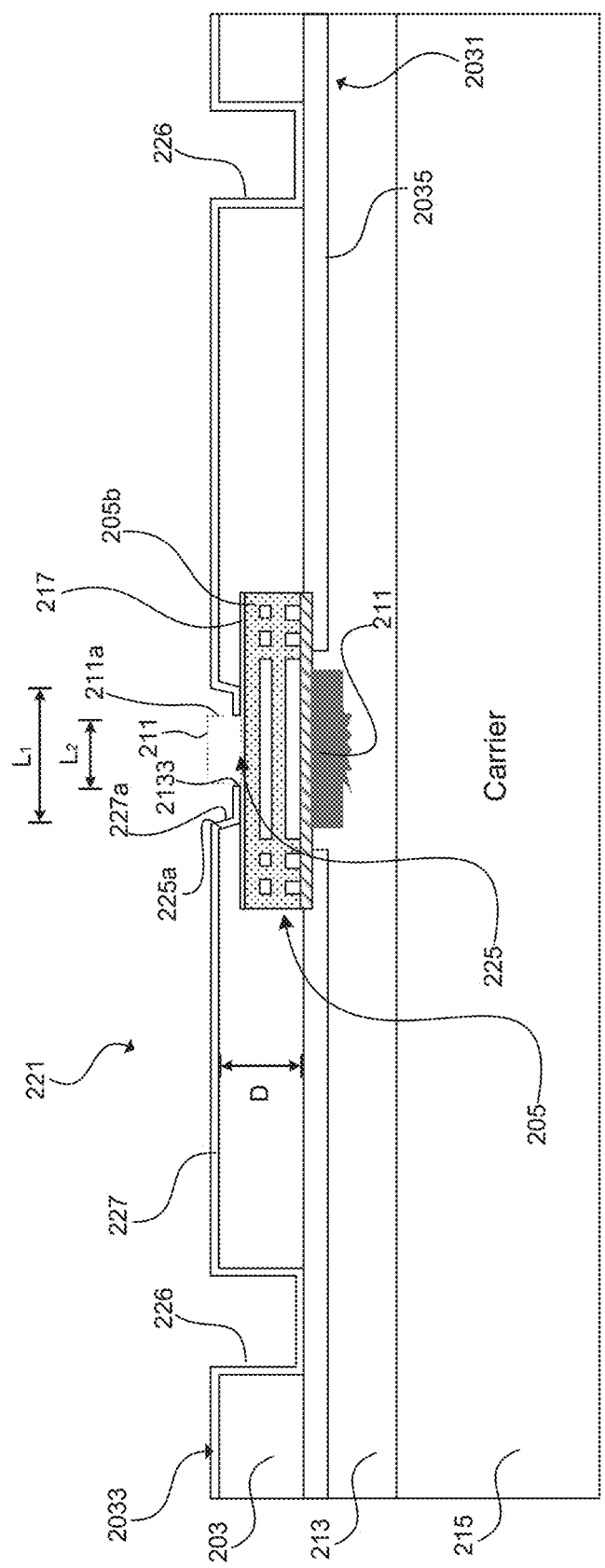

FIG. 2J shows the semiconductor package 203 after the second photo-resistant layer 229 has been removed. The recess 225 has a lateral dimension $L_1$ that is larger than the lateral dimension $L_2$ of the metal bump 211. As such, a sidewall 225a of the recess 225 and a sidewall portion 227a of the dielectric layer 227 are spaced apart from a sidewall 211a of the metal bump 211. The semiconductor device package 203 shown in FIG. 2J is ready for stacking.

Figure 3A:
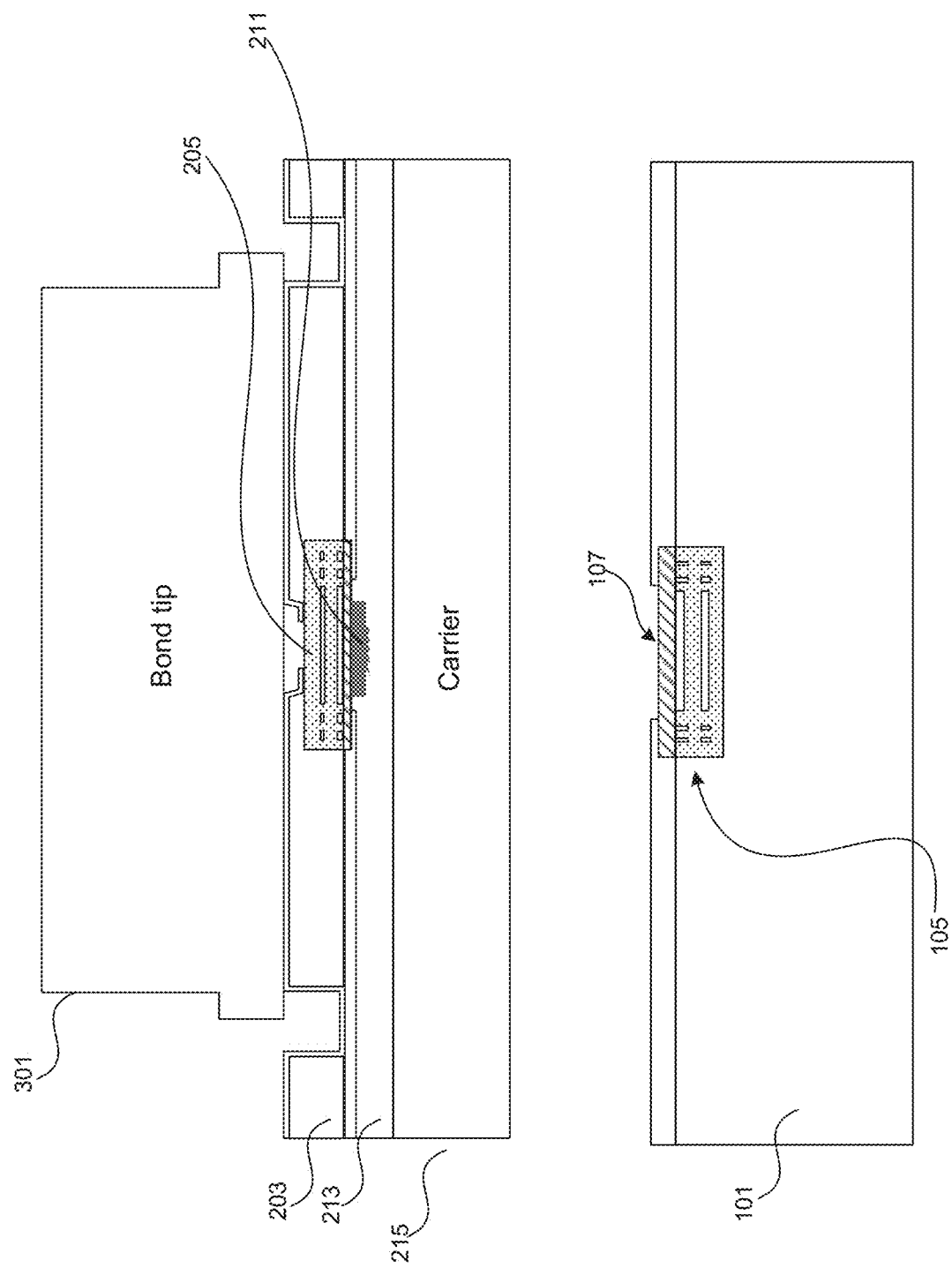
FIGS. 3A and 3B are schematic cross-sectional views illustrating a method of stacking a semiconductor device package in accordance with an embodiment of the present technology.
Figure 3B:
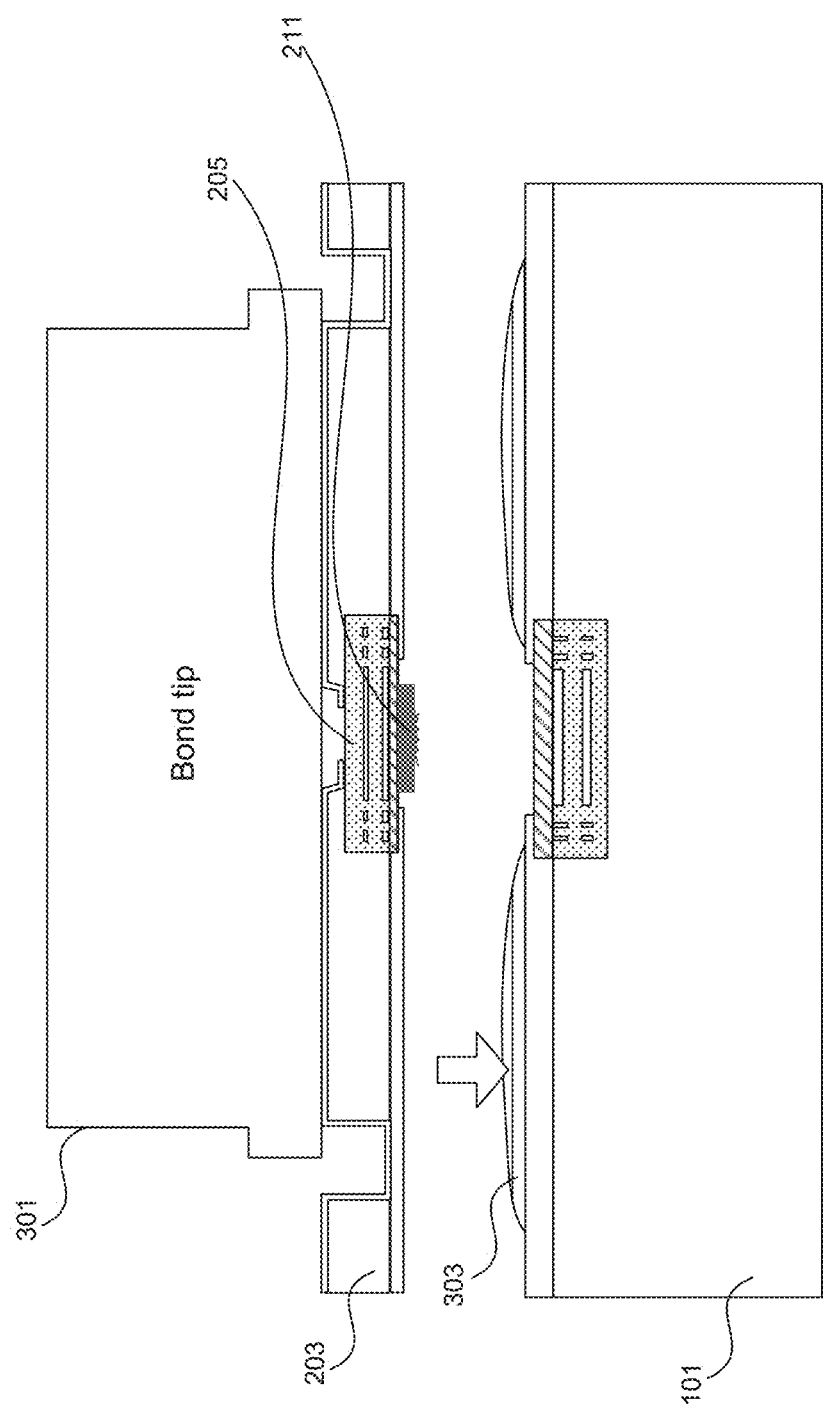

FIGS. 3A and 3B illustrate methods for stacking semiconductor device packages 203 in accordance with an embodiment of the present technology. As shown in FIG. 3A, a semiconductor device package 203 is coupled to or picked up by a bond tip 301. In some embodiments, the bond tip 301 can be a flip-chip tool or other suitable devices. The bond tip 301 is configured to temporarily hold the semiconductor device package 203 such that it can be stacked on the base substrate 101.

FIG. 3B shows a stage after bonding layer 213 has been removed by a laser or gas to detach the semiconductor device package 203 from the carrier 215 (FIG. 3A). When stacking the semiconductor device package 203 on the base substrate 101, the metal bump 211 is aligned with and coupled to the contacting area 107 of the base substrate 101. As a result, the metal bump 211 is electrically coupled to the metallization layer 105 in the base substrate 101. By this arrangement, the metallization layers 205 of the semiconductor device package 203 can electrically couple to the metallization layer 105 in the base substrate 101 without a TSV. This is advantageous because it eliminates the need to form deep vias in the substrate 2037, lining the substrate 2037 with dielectric and/or barrier layers, and electroplating conductive material into the lined vias commonly performed when forming TSVs.

Also shown in FIG. 3B, a die-attaching material 303 can be positioned between the semiconductor device package 203 and the base substrate 101 before stacking the semiconductor device package 203 on the base substrate 101. The die-attaching material 303 can bond the semiconductor device package 203 to the base substrate 101. In some embodiments, the die-attaching material 303 can include a polymer such as a B-stage polymer (e.g., an epoxy film that has been heat-cured). In some embodiments, the die-attaching material 303 can include a non-conductive film (NCF) or a non-conductive paste (NCP). In some embodiments, the die-attaching material 303 can be jet-dispensed or laminated onto the base substrate 101.

Figure 4A:
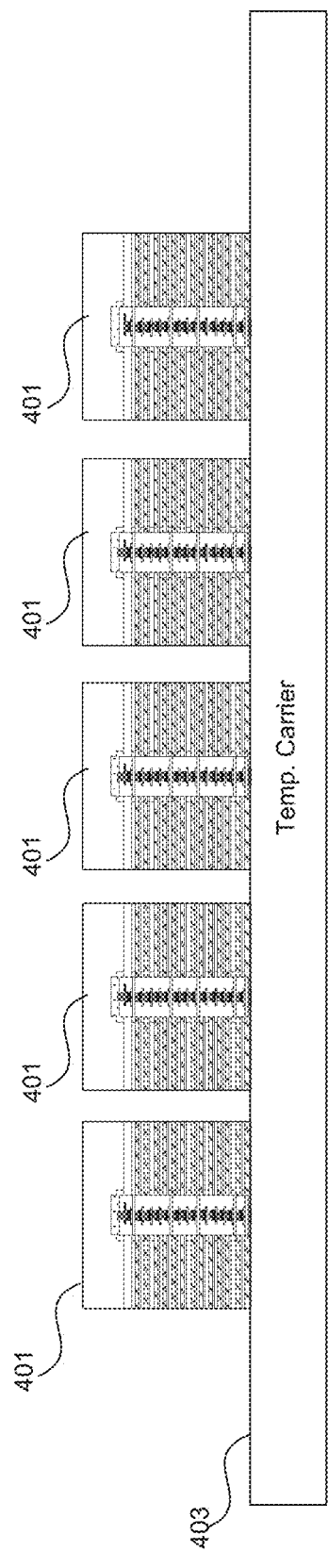
FIGS. 4A-4D are schematic cross-sectional views illustrating a method of processing multiple semiconductor device package assemblies in accordance with an embodiment of the present technology.

FIGS. 4A-4D illustrate methods of processing multiple semiconductor device package assemblies 401 in accordance with an embodiment of the present technology. In FIG. 4A, the multiple semiconductor device package assemblies 401 are carried by a temporary carrier 403. Each of the multiple semiconductor device package assemblies 401 includes a base substrate (e.g., the base substrate 101) and multiple semiconductor device packages (e.g., the semiconductor device packages 103 or 203). As shown, the back sides of the semiconductor device packages of the multiple semiconductor device package assemblies 401 are coupled to the temporary carrier 403. The multiple semiconductor device package assemblies 401 are spaced apart such that the multiple semiconductor device package assemblies 401 can later be separated during a singulation process.

Figure 4B:
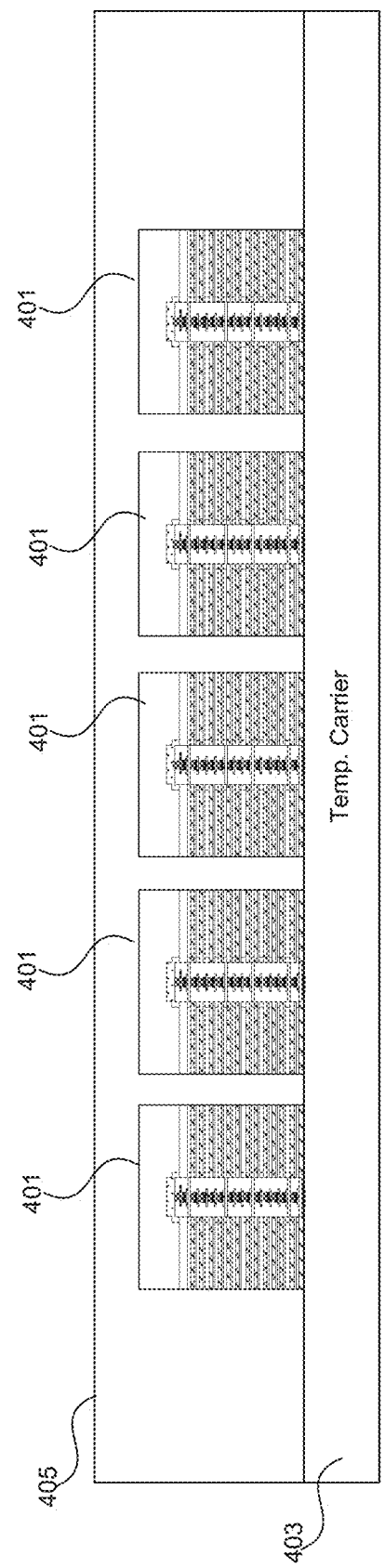

FIG. 4B shows the assembly after the multiple semiconductor device package assemblies 401 have been covered by an encapsulant material 405. In some embodiments, the encapsulant material 405 can include resin, plastic, silicon, oxide, polymer, or other suitable dielectric materials.

Figure 4C:
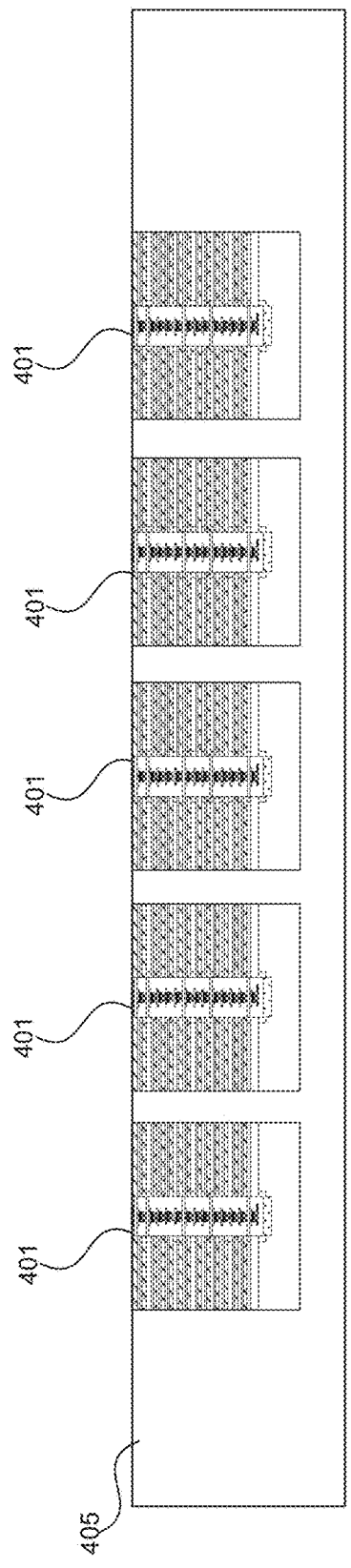

FIG. 4C shows the assembly after the temporary carrier 403 has been detached from the multiple semiconductor device package assemblies 401. In FIG. 4C, the multiple semiconductor device package assemblies 401 covered by the encapsulant material 405 are inverted compared to FIG. 4B.

Figure 4D:
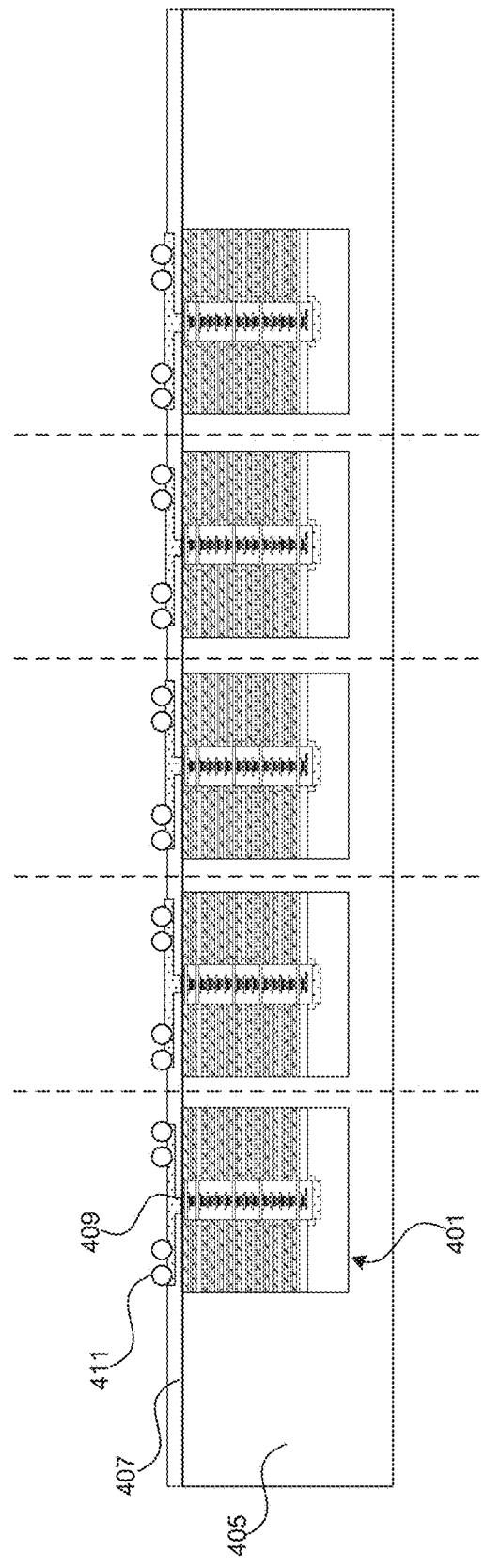

FIG. 4D shows the assembly after a polymer layer 407 has been formed on the multiple semiconductor device package assemblies 401. The method can include forming a redistribution layer 409 using the polymer layer 407. The redistribution layer 409 is electrically coupled to the metallization layers (e.g., the metallization layers 105 or 205) in individual semiconductor device package assembly 401. In some embodiments, the redistribution layer 409 can include copper or other suitable conductive material.

As shown in FIG. 4D, multiple connectors 411 can be formed on and electrically coupled to the redistribution layer 409. The connectors 411 are further electrically coupled to the metallization layers of the semiconductor device packages and the base substrates in the individual semiconductor device package assembly 401. In some embodiments, the connectors 411 can be ball grid array (BGA) connectors. In some embodiments, the connectors 411 can include a solder ball, a pad, or other suitable connecting devices. The multiple semiconductor device package assemblies 401 can then be "singulated" or separated, by cutting through the encapsulant material 405 at the locations indicated by dashed lines shown in FIG. 4D.

Figure 5:
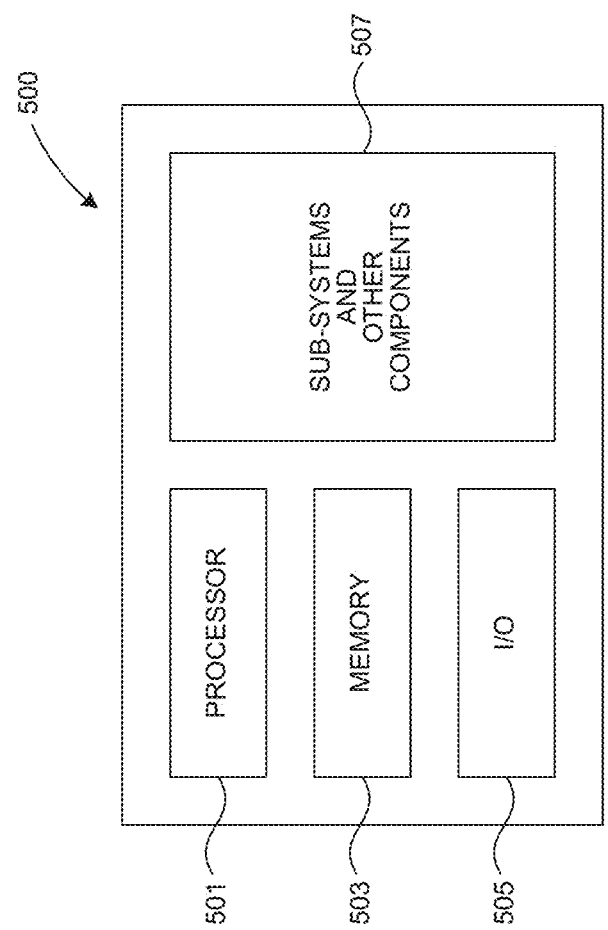
FIG. 5 is a block diagram illustrating a system that incorporates a semiconductor assembly in accordance with an embodiment of the present technology.

Any one of the semiconductor devices having the features described above with reference to FIGS. 1-4D can be incorporated into any of a myriad of larger and/or more complex systems, a representative example of which is a system 500 shown schematically in FIG. 5. The system 500 can include a processor 501, a memory 503 (e.g., SRAM, DRAM, flash, and/or other memory devices), input/output devices 505, and/or other subsystems or components 507. The semiconductor assemblies, devices, and device packages described above with reference to FIGS. 1-4D can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device package, comprising:
a semiconductor substrate having an active side and an inactive side opposite the active side, the substrate including
a first metallization layer positioned at the active side,
a second metallization layer at least partially embedded in the substrate and electrically coupled directly to the first metallization layer and without using a through-silicon via (TSV), wherein
the inactive side of the substrate includes a divot exposing a portion of the second metallization layer for providing a direct electrical connection between an external device and the second metallization layer; and
a metal bump protruding away from the active side, directly aligned with the divot, and electrically coupled to the first metallization layer.

2. The semiconductor device package of claim 1, wherein the substrate has a depth not more than 15 µm.

3. The semiconductor device package of claim 1, wherein the substrate has a depth not more than 10 µm.

4. The semiconductor device package of claim 1, wherein the substrate has a depth not more than 5 µm.

5. The semiconductor device package of claim 1, wherein the semiconductor device package is a first semiconductor device package, and wherein the metal bump is configured to electrically couple circuitry on the active side of the first semiconductor device package to a second semiconductor device package without using the TSV when the second semiconductor device package is attached facing the inactive side.

6. The semiconductor device package of claim 1, wherein:
the metal bump is a first metal bump,
the first and second metallization layers are configured to provide one or more electrical connections across a thickness of the first semiconductor substrate measured between opposing surfaces, and
the exposed portion of the second metallization layer is configured to directly attached to a second metal bump that is electrically coupled to a second semiconductor device package.

7. The semiconductor device package of claim 1, further comprising a passivation layer positioned at the active side of the substrate.

8. A semiconductor device package, comprising:
a semiconductor substrate having an active side and an inactive side opposite the active side, the substrate including
a first metallization layer positioned at the active side,
a second metallization layer at least partially embedded in the substrate and electrically coupled to the first metallization layer, wherein
the inactive side of the substrate includes a divot exposing a portion of the second metallization layer for providing an external electrical connection;
a metal bump protruding away from the active side, directly aligned with the divot, and electrically coupled to the first metallization layer;
a dielectric layer formed at the inactive side of the substrate, the dielectric layer having a dielectric opening within the divot and over the exposed portion of the second metallization layer; and
a barrier layer disposed between the dielectric layer and the second metallization layer, the barrier layer including a barrier opening over the exposed portion of the second metallization layer.

9. The semiconductor device package of claim 1, wherein the metal bump includes an indium metal bump.

10. The semiconductor device package of claim 8, wherein the barrier layer includes tantalum.

11. The semiconductor device package of claim 1, wherein the first metallization layer includes aluminum.

12. The semiconductor device package of claim 1, wherein the second metallization layer includes copper.

13. The semiconductor device package of claim 1, further comprising a third metallization layer positioned between and electrically coupled to the first and second metallization layers.

14. The semiconductor device package of claim 13, wherein the third metallization layer includes copper.

15. A semiconductor device package assembly, comprising:
a base substrate having a first side and a second side opposite the first side, the base substrate having a first set of metallization layers at the first side, the first set of metallization layers having a contacting area; and
at least one semiconductor device package stacked on the base substrate, each of the at least one semiconductor device package having
an active side and an inactive side,
a second set of metallization layers at the active side, wherein
a portion of the second set of metallization layers is exposed through a divot in the inactive side, and
the second set of metallization layers is electrically coupled directly to the first set of metallization layers and without using a through-silicon via (TSV),
a metal bump in the divot and electrically coupled to the second set of metallization layers, wherein the metal bump is electrically coupled to the first set of metallization layers at the contacting area; and
wherein the at least one semiconductor device package has a depth not more than 30 µm.

16. The semiconductor device package assembly of claim 15, wherein the depth is not more than 20 µm.

17. The semiconductor device package assembly of claim 15, wherein the at least one semiconductor device package is a first semiconductor device package, and wherein the metal bump is a first metal bump, and wherein the divot of the first semiconductor device package is configured to receive a second metal bump of a second semiconductor device package such that the second metal bump electrically couples to the second set of metallization layers of the first semiconductor device package without using a TSV.

18. A method of manufacturing a semiconductor device package, comprising:
forming a semiconductor substrate having an active side and an inactive portion opposite the active side;
forming first and second metallization layers in the substrate at the active side, the first and second metallization layers being separated across at least a portion of a thickness of the semiconductor substrate and electrically coupled to each other without using a through-silicon via (TSV);
forming a metal bump electrically coupled to the first metallization layer; and
thinning the semiconductor substrate to a depth not more than 30 µm based on removing a portion of the inactive portion;
forming a divot at a surface of the remaining inactive portion of the substrate, the divot being directly aligned with the metal bump; and exposing a portion of the second metallization layer through the divot, wherein the exposed portion is configured to provide a direct electrical connection to an external circuit.

19. The method of claim 18, wherein the semiconductor device package is a first semiconductor device package, and wherein the metal bump is a first metal bump, and wherein the method further comprises:

positioning a second metal bump of a second semiconductor device package in the divot such that the second metal bump electrically couples to the first and second metallization layers of the first semiconductor device package without using a TSV.

\* \* \* \* \*